United States Patent
Knoblinger

(10) Patent No.: US 7,667,499 B2
(45) Date of Patent: Feb. 23, 2010

(54) MUGFET CIRCUIT FOR INCREASING OUTPUT RESISTANCE

(75) Inventor: Gerhard Knoblinger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 268 days.

(21) Appl. No.: 11/761,215

(22) Filed: Jun. 11, 2007

(65) Prior Publication Data

US 2008/0303593 A1  Dec. 11, 2008

(51) Int. Cl.
H03K 19/20 (2006.01)
H03K 19/094 (2006.01)

(52) U.S. Cl. ........................ 326/119; 326/121

(58) Field of Classification Search ............... 326/112, 326/119, 121
See application file for complete search history.

(56) References Cited

U.S. PATENT DOCUMENTS

| | | | |
|---|---|---|---|
| 5,751,167 A * | 5/1998 | Karube | 326/73 |
| 6,433,609 B1 * | 8/2002 | Voldman | 327/313 |
| 7,180,135 B1 * | 2/2007 | Ioannou et al. | 257/347 |
| 2004/0100306 A1 * | 5/2004 | Krivokapic et al. | 326/112 |
| 2005/0285625 A1 * | 12/2005 | Kimura | 326/83 |
| 2007/0013413 A1 * | 1/2007 | Chiang et al. | 326/121 |
| 2009/0051384 A1 * | 2/2009 | Katayama | 326/6 |

* cited by examiner

Primary Examiner—Vibol Tan
Assistant Examiner—Jason Crawford
(74) Attorney, Agent, or Firm—Schwegman Lundberg & Woessner, P.A.

(57) ABSTRACT

In an embodiment, an apparatus includes a MuGFET device coupled to a reference source, the MuGFET device configured to receive an input signal at a gate thereof; and Also includes a further MuGFET device coupled between the MuGFET device and a first terminal of a load, a second terminal of the load coupled to a further reference source, the further MuGFET device configured to receive a further input signal at a gate thereof, and wherein the MuGFET device and the further MuGFET device are disposed above a substrate and configured to provide an output signal at the first terminal of the load.

15 Claims, 3 Drawing Sheets

US 7,667,499 B2

MUGFET CIRCUIT FOR INCREASING OUTPUT RESISTANCE

TECHNICAL FIELD

Various embodiments described herein relate to semiconductor devices and, more particularly, to field effect transistors.

BACKGROUND

Multi-gate field effect transistor devices are often designed for applications with scaled-down extremely small devices which operate at low supply voltages. Moreover, multi-gate devices have gates on multiple sides of the conducting channel thereby providing better control of the semiconductor device.

DETAILED DESCRIPTION

Figure 1:
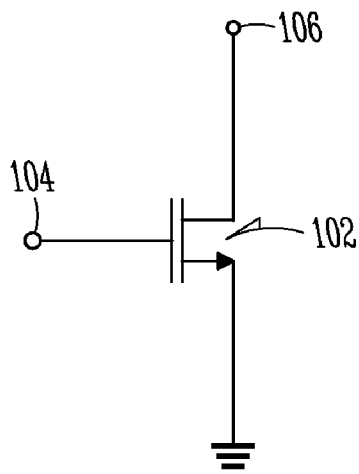
FIG. 1 is a schematic view of a conventional MuGFET circuit.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the following description, the terms "wafer" and "substrate" may be used interchangeably to refer generally to any structure on which integrated circuits are formed and also to such structured during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "multiple gate field effect transistor" (MuGFET) is used interchangeably with FinFET herein for the general class of semiconductor devices having field effect transistors formed above a buried oxide layer of a substrate. Embodiments of the invention may be realized using MuGFETs having either p type or n type channel doping of the fins. Thus source and drain terminals may sometimes be referred to herein as "source/drain" terminals.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

The following disclosure relates in general to providing for operation of structures employing multiple circuit blocks, some of which include MuGFET devices. Multiple MuGFET devices are formed above a buried oxide contact region of a single substrate and supported by the substrate. In general, this is different from planar CMOS devices which have a conducting channel only at the surface of the silicon. Bulk CMOS devices require increased doping levels with increased scaling. This adversely affects carrier mobility and junction capacitance. Additionally, planar devices usually only have a single gate on the surface of the silicon to control the channel on the surface of the semiconductor as opposed to their MuGFET counterparts which can have multiple gates formed around a raised channel. Moreover, the multiple gate configuration provides for greater control of the conducting channel and reduces detrimental performance due to short channel effects. Furthermore, multi-gate semiconductor devices provide better turn-on characteristics and have lower leakage current characteristics compared to planar CMOS devices.

In some embodiments, because the MuGFET devices are electrically insulated from the substrate and each other by being formed above the buried oxide region, individual devices can be connected to separate sources of reference potential and to separate power supplies. Other semiconductor devices may also be formed above and supported by the substrate in contact regions thereof which are not insulated by the buried oxide contact region. The various circuit blocks can be coupled to each other by a suitable coupling element or coupling network despite their being operatively coupled to different sources of reference potential. In some embodiments the circuit blocks are driven from different power sources.

FIG. 1 a simplified schematic of a conventional MuGFET device 102. Device 102 has a source terminal thereof coupled to a source of reference potential such as ground, a gate coupled to an input terminal 104, and an output terminal 106. The small signal impedance of device 102 is expressed as $r_{ds}$ which is the output impedance of MuGFET 102 at terminal 106.

Figure 2:
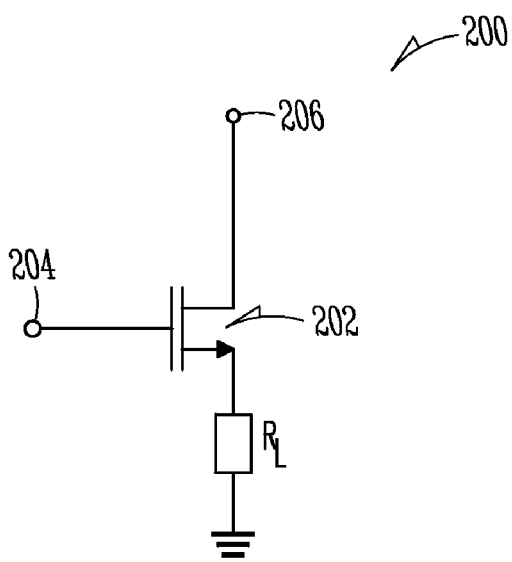
FIG. 2 is a schematic view of a conventional MuGFET circuit.

FIG. 2 is a simplified schematic of a conventional MuGFET circuit 200. Circuit 200 comprises a p channel MuGFET device 202 having its source coupled to one terminal of a load such as resistor $R_L$, the other terminal of which is coupled to a source of reference potential which may be ground. The drain terminal of MuGFET 202 is connected to an output terminal 208 and the gate is coupled to an input terminal 204. The output resistance of MuGFET circuit 200 is:

$$R_{out} = g_m * r_{ds} * R_L$$

where $g_m$ is the transconductance and $r_{ds}$ is the small signal drain-to-source resistance of MuGFET 202.

In some embodiments, multiple MuGFET devices can be connected in a cascode configuration which provides high output resistance and allows for reduction of Miller effect from other connection configurations. This type of configuration provides for better high-frequency performance and higher output resistance. An amplifier stage having a cascode configuration can be used as the gain element in amplifier stages when the Miller effect is an issue. Cascode stages are also used in circuits having current sources and as non-linear loads where the output resistance of a single transistor stage is not sufficient. As devices are made smaller and faster, the output resistance often suffers. The cascode configuration offers a way of improving performance in such circuits.

Figure 3:
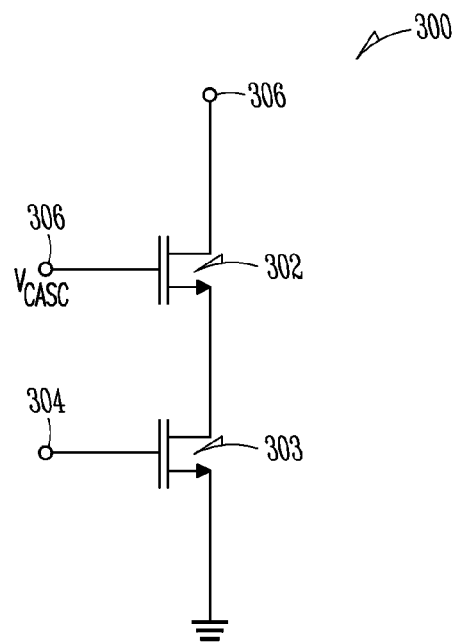
FIG. 3 is a schematic view of a multiple MuGFET circuit according to some embodiments of the invention.

FIG. 3 is a simplified schematic of a MuGFET cascode circuit 300, according to some embodiments of the invention. In some embodiments, circuit 300 includes a first MuGFET device 302 having a source/drain terminal coupled to a terminal 306, and a source/drain terminal coupled to a source/drain terminal of a second MuGFET 303 the source/drain of which is coupled to a source of reference potential such as ground. MuGFET 302 has a gate coupled to an input terminal 306 which, in some embodiments is connected to a source of bias voltage, $V_{case}$. MuGFET 303 has a gate coupled to an input terminal 304 which is connected to receive a signal $V_{in}$.

MuGFET circuit 300 has an output terminal 306. The small signal output resistance of MuGFET circuit 300 at terminal 306 is:

$$R_{out} = g_{m2} * r_{ds2} * r_{ds1}$$

where $g_{m2}$ is the transconductance of MuGFET 302 and $r_{ds1}$ and $r_{ds3}$ are the small signal drain-to-source resistance of MuGFETs 302 and 303 respectively. Replacing $R_L$ with MuGFET 303 allows a more efficient use of chip area because a resistor consumes much more chip area for the same resistance as does a MuGFET.

Figure 4:
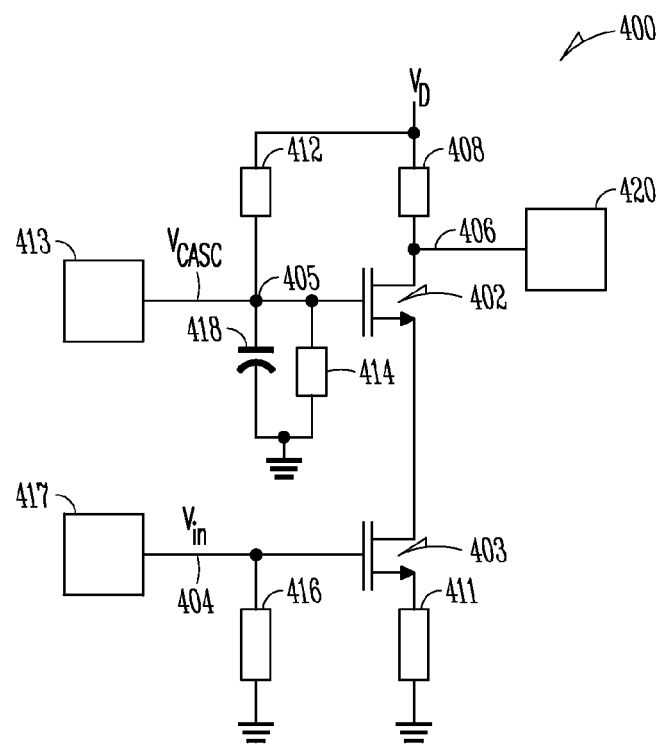
FIG. 4 is a more detailed schematic view of the MuGFET circuit of FIG. 3 connected according to some embodiments of the invention.

FIG. 4 is a more detailed schematic of some circuit embodiments of the MuGFET circuit of FIG. 3. In some embodiments, circuit 400 includes a MuGFET device 402 having a drain coupled to a voltage source, $V_D$ by a load such as resistor 408, and a source coupled to drain of a MuGFET device 403, the source of which is coupled by a load such as resistor 411 to a source of reference potential such as ground. In some embodiments, a relatively low impedance resistor 411 may be connected between ground and the source region of MuGFET 403 to couple the source of MuGFET 403 to ground. MuGFET 402 has a gate coupled to an input terminal 405 which, in some embodiments is connected to a source of bias voltage 413, $V_{case}$.

In circuit 400, the voltage available at the gate of MuGFET 402 is determined by the magnitude of supply voltage $V_D$ multiplied by the ratio of resistor 412 to resistor 414, since the resistance at the gate of MuGFET 402 is very high in some embodiments. MuGFET 403 has a gate coupled to an input terminal 404 which is connected to receive a signal $V_{in}$ which, in some embodiments is applied across an input resistor 416. In some embodiments, the signal $V_{in}$ is provided by an input circuit 417 selected from a group of front end circuits consisting of amplifiers, pre-amplifiers, amplitude modulation circuits, and reference voltage sources.

In the circuit shown in FIG. 4, upper MuGFET 402 acts as a load for lower MuGFET 403. Because capacitor 418 acts effectively as a ground, the source voltage of upper MuGFET 402 is held at a nearly constant voltage during operation, thereby reducing the Miller feedback capacitance from the drain to the gate of lower MuGFET 403, compared to what would occur if upper MuGFET 402 were a typical inductive/resistive load and the output were taken from the drain of MuGFET 403. Thus the only terminals with substantial voltage swings are input terminal 404 and output terminal 406, and those terminals are separated by the central connection of nearly constant voltage and the physical separation of MuGFETs 402 and 403.

The inclusion of MuGFET 402 permits MuGFET 403 to operate at maximum input impedance and minimum negative feedback (i.e., Miller effect feedback), improving its gain. Miller effect performance limitations are avoided because the gate of MuGFET 402 is electrically grounded and stray capacitance from its drain to its source will not reduce its gain because the voltages are in-phase.

The cascode arrangement of circuit 400 has improved performance stability. The output at terminal 406 is proportional to the input signal $V_{in}$, is effectively isolated from the input at terminal 404 both electrically and physically. In some embodiments, the output at terminal 406 is input to further utilization circuitry 420 selected from the group consisting of further amplifier stages, output stages and circuits for receiving a compensated current from a current mirror.

In some embodiments, the saturation drain-to-source saturation current of MuGFET 402 is higher than that of MuGFET 403 or drain voltage of MuGFET 402 to prevent it from falling too low and causing it to leave saturation. In some embodiments, both MuGFETs 402 and 403 are biased with a drain to source voltage, $V_{DS}$, sufficient to facilitate their performance.

Figure 5:
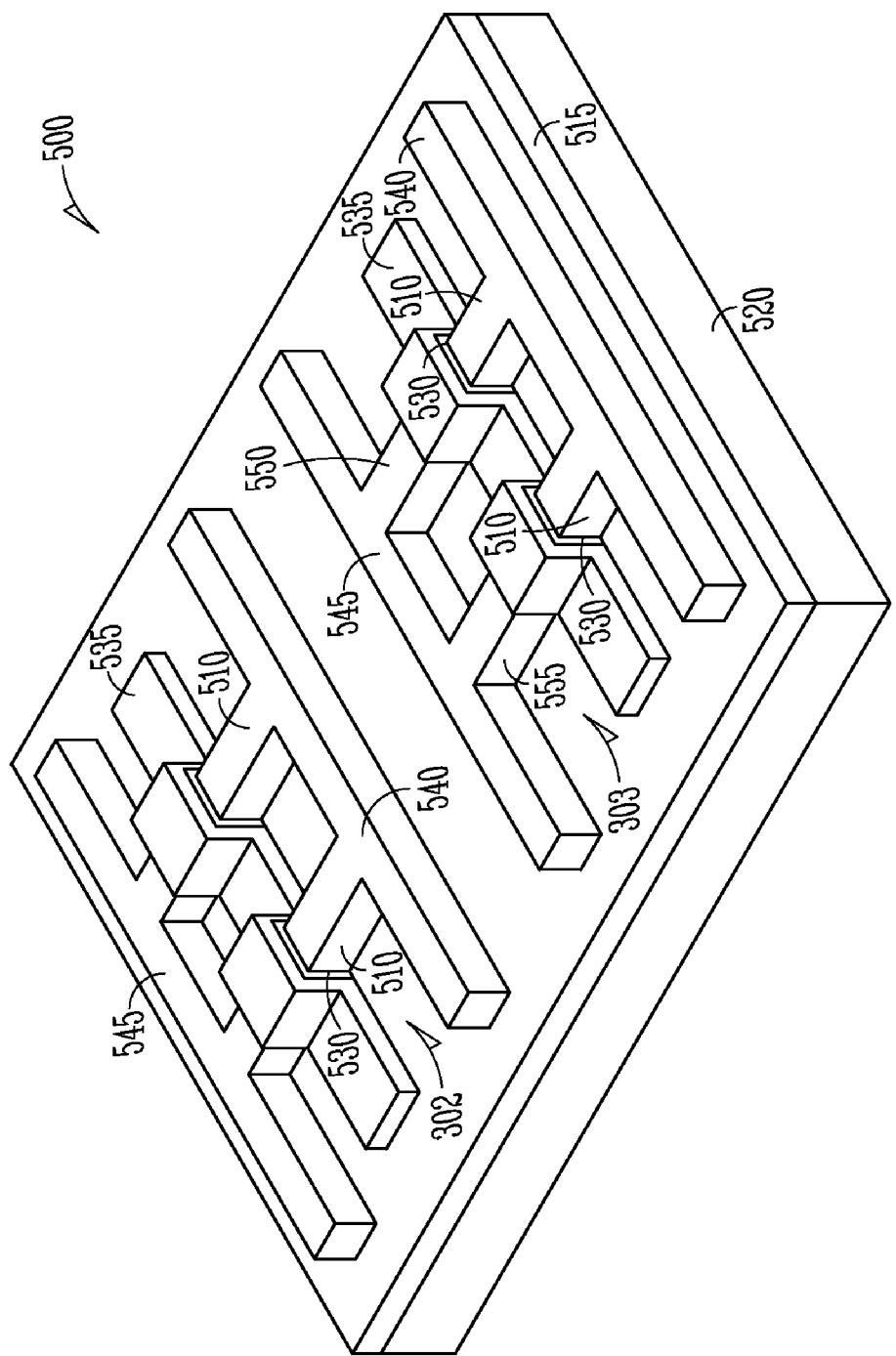
FIG. 5 is a simplified perspective view of the MuGFET circuit of FIG. 3, according to some embodiments of the invention.

FIG. 5 is a simplified perspective view of the MuGFET device 500 corresponding to the circuit 300 shown in the schematic diagram of FIG. 3, according to some embodiments of the invention. In order to simplify FIG. 5, it does not illustrate the metallization layers which, in some embodiments, connect the gate, source and drain terminals of MuGFETs 302 and 303 and does not illustrate the resistors 408, 411, 412, 414, 416, capacitor 418, or the upstream, downstream and bias circuits 417, 420, 413 which are all shown in the embodiment illustrated in the more detailed schematic of FIG. 4.

MuGFETs 302 and 303 may be p-doped or an n-doped fin transistors. Each has at least one fin 310. The fins may be disposed above an insulating surface 315 of a substrate 320. In some embodiments, substrate 320 is preferably monocrystalline silicon, although it is also possible to use any other desired semiconductor substrates, such as silicon on insulator (SOI), and germanium or other Group III-IV semiconductors. In some embodiments, the insulating surface may be a buried oxide or other insulating layer 315 over a silicon or other semiconductor substrate 320. A gate dielectric structure 330 is formed over the top and on the sides of the semiconductor fins 310. A gate electrode 335 is formed over the top and on the sides of the gate dielectric 330 and may include a metal layer. Source/drain regions 340 and 345 may be formed on either side of the gate electrode 335, and those regions may be laterally expanded to engage multiple fins 310, in various embodiments.

Each fin 310 has a top surface 350 and laterally opposite sidewalls 355. Each fin 310 has a height or thickness equal to T and a width equal to W. The gate width of a single fin MuGFET transistor is equal to the sum of the gate widths of each of the three gates formed on the semiconductor body, or, T+W+T, which provides high gain. In some embodiments, the lateral cross-section of the fin is substantially in the shape of a rectangle. In other embodiments, the lateral cross-section of the fin is substantially in the shape of a rectangle with rounded corners. In an embodiment, the height-to-width ratio of the fin is substantially in the range of 3:1 to 5:1. In an embodiment, the width of the fin is substantially 20 nm.

In some embodiments described above, the fin 310 is made of silicon. In some embodiments, the fin 310 can be made of other semiconductor materials, like germanium, silicon carbide, gallium arsenide, as well as indium phosphide. In some embodiments, the fin 310 may be coated with a thin film of silicate, for example, with a thickness of approximately 10 nm. In some embodiments such as shown in FIG. 5, a plurality of fins may be used as opposed to a single fin 310. In such configurations the increase in the number of fins allows for increasing the amount of current conducted through the conducting channel (provided by the multiple fins) between the source and drain regions.

Better noise immunity results from forming the transistors on an insulator. Formation on the insulator provides isolation between devices, and hence the better noise immunity. It further alleviates the need for multiple large well areas to reduce leakage currents, further leading to reduced real estate needs. Having the gate traverse two or more sides of the fin or channel results in much quicker off current than prior bulk CMOS or planar devices. Further, the current characteristics of p-doped MuGFET devices may exhibit similar or higher gain than corresponding n-doped MuGFET devices. This may reduce the potential effects of degradation of devices over time. Since the channels are formed by the use narrow fins, improved matching of the devices is significantly easier than in bulk or planar CMOS devices, allowing better control of their current characteristics.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . "

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. Apparatus, comprising:
a MuGFET device coupled to a reference source, the MuGFET device configured to receive an input signal at a gate thereof;
a further MuGFET device coupled between the MuGFET device and a first terminal of a load, a second terminal of the load coupled to a further reference source, the further MuGFET device configured to receive a further input signal at a gate thereof, and wherein the MuGFET device and the further MuGFET device are disposed above a substrate and configured to provide an output signal at the first terminal of the load; and
a capacitor to couple the gate of the MuGFET device to the reference source.

2. The apparatus of claim 1, wherein a first source/drain terminal of the MuGFET device is coupled to the reference source.

3. The apparatus of claim 2, wherein a second source/drain terminal of the MuGFET device is coupled to a first source/drain terminal of the further MuGFET device and a second source/drain terminal of the further MuGFET device is coupled to the first terminal of the load.

4. The apparatus of claim 1 wherein the input signal is a bias voltage for the MuGFET.

5. The apparatus of claim 1, wherein the MuGFET device includes a plurality of fins.

6. The apparatus of claim 1, wherein the further MuGFET device includes a plurality of fins.

7. The apparatus of claim 1, wherein the MuGFET device and the further MuGFET device are disposed above an insulating layer of the substrate.

8. Apparatus, comprising:
a first MuGFET device including a first source, a first drain and a first gate;
a second MuGFET device including a second source, a second drain and a second gate, the second source coupled to the first drain and the first source coupled to a first reference voltage, the first gate configured to receive an input signal, the second gate configured to receive a bias voltage, the second drain coupled to one end of a load and a second end of the load coupled to a second reference voltage, wherein the first MuGFET device and the second MuGFET are supported by a substrate and configured to generate an output signal at the first end of the load which is proportional to the input signal; and
a capacitor to couple the gate of the first MuGFET device to the first reference source.

9. The apparatus of claim 8, wherein the first MuGFET device includes a first plurality of fins.

10. The apparatus of claim 8, wherein the second MuGFET device includes a second plurality of fins.

11. The apparatus of claim 8, wherein the first MuGFET device and the second MuGFET device are disposed above an insulating layer of the substrate.

12. Apparatus, comprising:
a MuGFET device coupled to a first reference source, and coupled to a signal source to receive a first input signal at a gate thereof;
a further MuGFET device coupled between the MuGFET device and a first terminal of a load, a second terminal of the load coupled to a further reference source, the further MuGFET device coupled to a further signal source to receive a second input signal at a gate thereof, and wherein the MuGFET device and the further MuGFET device are disposed above a substrate and configured to provide an output signal to a utilization circuit coupled to the first terminal of the load; and a capacitor to couple the gate of the MuGFET device to the first reference source.

13. The apparatus of claim 12, wherein the first input signal is a bias voltage.

14. The apparatus of claim 12, wherein the second input signal is provided by one or more input circuits selected from the group of front end circuits consisting of amplifiers, pre-amplifiers, amplitude modulation circuits, and reference voltage sources.

15. The apparatus of claim 12, wherein the output signal is provided to a utilization circuit selected from a group of utilization circuits consisting of further amplifier stages, output stages and circuits for receiving a compensated current from a current mirror.

* * * * *

UNITED STATES PATENT AND TRADEMARK OFFICE
CERTIFICATE OF CORRECTION

PATENT NO. : 7,667,499 B2
APPLICATION NO. : 11/761215
DATED : February 23, 2010
INVENTOR(S) : Gerhard Knoblinger It is certified that error appears in the above-identified patent and that said Letters Patent is hereby corrected as shown below:

On the title page, item (57), under "Abstract", in column 2, line 3, delete "Also" and insert -- also --, therefor.

In column 6, line 25, in Claim 4, delete "MuGFET." and insert -- MuGFET device. --, therefor.

In column 6, line 44, in Claim 8, after "MuGFET" insert -- device --.

Signed and Sealed this

Twelfth Day of October, 2010

David J. Kappos
*Director of the United States Patent and Trademark Office*